United States Patent
Fisher et al.

(10) Patent No.: US 9,950,404 B1
(45) Date of Patent: Apr. 24, 2018

(54) HIGH THROUGHPUT POLISHING SYSTEM FOR WORKPIECES

(75) Inventors: Stephen M. Fisher, San Jose, CA (US); Robindranath Banerjee, San Jose, CA (US); Christopher L. Beaudry, San Jose, CA (US); Brian J. Brown, Palo Alto, CA (US)

(73) Assignee: ALTA DEVICES, INC., Sunnyvale, CA (US)

( * ) Notice: Subject to any disclaimer, the term of this patent is extended or adjusted under 35 U.S.C. 154(b) by 587 days.

(21) Appl. No.: 13/434,726

(22) Filed: Mar. 29, 2012

(51) Int. Cl.
*B24B 37/04* (2012.01)
*B24B 7/22* (2006.01)

(52) U.S. Cl.
CPC .............. *B24B 7/228* (2013.01); *B24B 7/224* (2013.01)

(58) Field of Classification Search
CPC ......... B24D 18/00; B24B 37/26; B24B 7/224; B24B 7/228; B24B 7/241; B24B 7/242; B24B 7/244; B24B 7/245; B24B 7/247; B24B 7/248; B24B 37/04
USPC .................................................. 451/159, 160
See application file for complete search history.

(56) References Cited

U.S. PATENT DOCUMENTS

| | | | | |
|---|---|---|---|---|
| 817,798 | A * | 4/1906 | Peirce | 451/65 |
| 2,949,707 | A * | 8/1960 | Staelin | 451/41 |
| 2,985,989 | A * | 5/1961 | Knost | 451/41 |
| 3,019,564 | A * | 2/1962 | Haracz | 451/160 |
| 3,449,870 | A * | 6/1969 | Jensen | 451/36 |
| 3,805,456 | A * | 4/1974 | Williams | 451/259 |
| 4,098,031 | A * | 7/1978 | Hartman et al. | 451/54 |
| 4,704,823 | A * | 11/1987 | Steinback | 451/261 |
| 4,833,832 | A * | 5/1989 | Lindsey et al. | 451/41 |
| 4,914,870 | A * | 4/1990 | Toncelli | 451/41 |
| 5,276,999 | A * | 1/1994 | Bando | 451/303 |
| 5,335,453 | A * | 8/1994 | Baldy et al. | 451/168 |
| 5,908,347 | A * | 6/1999 | Nakajima et al. | 451/5 |
| 6,626,744 | B1 * | 9/2003 | White et al. | 451/66 |
| 7,413,496 | B2 * | 8/2008 | Yoshimura et al. | 451/5 |
| 8,684,791 | B2 * | 4/2014 | Stern | 451/11 |
| 2002/0055323 | A1 * | 5/2002 | McClain | B24B 37/042 451/41 |
| 2003/0092359 | A1 * | 5/2003 | Pedrini | 451/5 |

(Continued)

FOREIGN PATENT DOCUMENTS

JP    08037155 A  *  2/1996
JP    200527111 A  * 10/2005

(Continued)

OTHER PUBLICATIONS

"High production lines for polishing granite slabs," Breton, Levibreton KG 3600, 26 pages, Sep. 2012.

*Primary Examiner* — Christopher M Koehler
*Assistant Examiner* — Joel Crandall
(74) *Attorney, Agent, or Firm* — Arent Fox LLP

(57) ABSTRACT

A method and system for polishing a plurality of workpieces is disclosed. The method and system comprises providing a polishing tool with multiple polishing heads; and providing a substrate tray that can hold the plurality of work pieces in a fixed position on a tray underneath the polishing heads. The system and method includes moving the tray within the polisher. Finally, the method and system includes configuring the multiple polishing heads with the appropriate pad/slurry combinations to polish the workpieces and to create a finished polished surface on the plurality of work pieces.

16 Claims, 9 Drawing Sheets

(56) References Cited

U.S. PATENT DOCUMENTS

| | | | |
|---|---|---|---|
| 2006/0194525 A1* | 8/2006 | Tolles | B08B 1/007 451/66 |
| 2007/0082586 A1* | 4/2007 | Ferrari | 451/28 |
| 2007/0099546 A1* | 5/2007 | Jespersen | 451/11 |
| 2007/0202777 A1* | 8/2007 | Yasui | B24B 37/08 451/36 |
| 2008/0164458 A1* | 7/2008 | Tanikella et al. | 257/13 |
| 2009/0221217 A1* | 9/2009 | Gajaria et al. | 451/58 |
| 2009/0325467 A1* | 12/2009 | Nakamura et al. | 451/28 |
| 2010/0258528 A1* | 10/2010 | Singh | C09G 1/02 216/53 |
| 2013/0068588 A1* | 3/2013 | Lofaro | 198/339.1 |

FOREIGN PATENT DOCUMENTS

| | | | | |
|---|---|---|---|---|
| JP | 2005271111 A | * | 10/2005 | |
| JP | 2009095923 A | * | 5/2009 | |
| WO | WO 2007014732 A2 | * | 2/2007 | B24B 7/224 |

\* cited by examiner

100

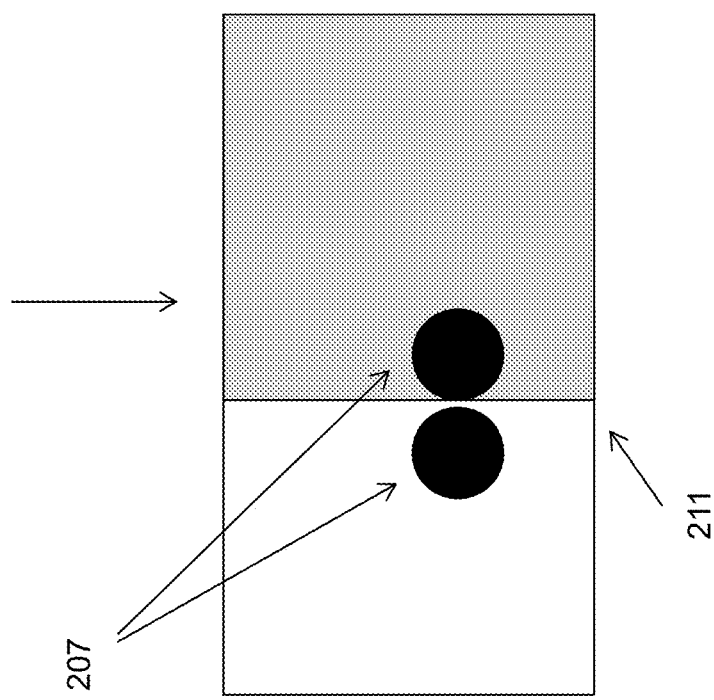

HIGH THROUGHPUT POLISHING SYSTEM FOR WORKPIECES

FIELD OF THE INVENTION

The present invention relates generally to a polishing system for workpieces and more specifically to a high throughput polishing system.

BACKGROUND OF THE INVENTION

For many applications it is important to polish a workpiece using a chemical mechanical polishing (CMP) process. Oftentimes conventional CMP processing techniques for workpieces such as for photovoltaic devices, magnetic devices and the like are prohibitively expensive. Accordingly, there is a need to provide a process that addresses the above-identified issues. The present invention addresses such a need.

SUMMARY OF THE INVENTION

A method and system for polishing a plurality of workpieces is disclosed. The method and system comprises providing a polishing tool with multiple polishing heads; and providing a substrate tray that can hold the plurality of work pieces in a fixed position on a tray underneath the polishing heads. The system and method includes moving the tray within the polisher. Finally, the method and system includes configuring the multiple polishing heads with the appropriate pad/slurry combinations to polish the workpieces and to create a finished polished surface on the plurality of work pieces.

A system and method in accordance with the present invention in an embodiment can modify the architecture of a slab polishing tool, to meet the high throughput and quality requirements for the finishing of other types of workpieces. In an embodiment an array of polishing heads is configured over a high speed conveyor belt to enable the refinishing of semiconductor substrates at very high speeds.

BRIEF DESCRIPTION OF THE DRAWINGS

FIG. 3A-3G illustrates movement of two of the first set of the polishing heads across the wafer tray as the tray moves down the conveyor.

DETAILED DESCRIPTION

Figure 1:
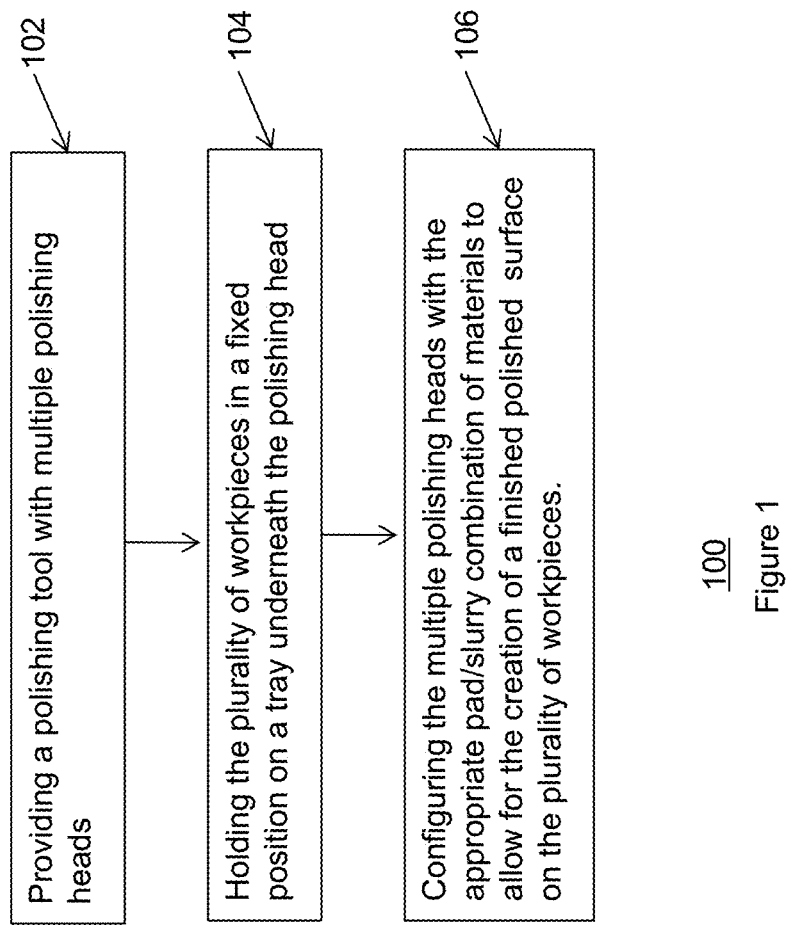
FIG. 1 is a flow chart of the operation of an automated polishing system in accordance with an embodiment.

The present invention relates generally to a polishing system for workpieces and more specifically to a high throughput polishing system. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

It is important to polish a workpiece in a variety of environments. What is meant by a workpiece is, for example, a semiconductor substrate, a magnetic device, an optoelectronic device or the like.

There are known methods for polishing such devices. For example, the silicon (Si) based solar industry has leveraged a variety of equipment that was originally developed for the semiconductor industry. By selecting simple processes and focusing on greatly improving tool throughput it has been possible to scale up semiconductor equipment to the point where it meets the very low cost requirements necessary for success in the solar industry. Polishing was used in the early days of the solar industry to provide the type of crystal structure and surface finish needed for high performance solar cells. The process has subsequently been replaced by a simpler low cost acid etch treatment.

For a GaAs-based solar process where epitaxial lift off (ELO) is used to form the solar cell, a polishing process is still required. The ELO process uses the substrate as a passive crystal structure template to form the solar cell through metal-organic chemical vapor deposition (MOCVD). The photovoltaic cell is lifted off of the substrate through an etching process. The ELO process, however, can result in some residual damage to the substrate surface, and a polishing process is necessary to restore that surface to an "epi ready" condition for the deposition of the next solar cell layer.

A GaAs-based photovoltaic cell process starts with the same grade of substrate that is used to make high speed semiconductor devices. These wafers are processed on the standard rotary polishing tools that enable a high degree of control on mechanical tolerances as well as surface finish. These substrates are expensive and the ELO process enables multiple cells to be built on the same substrate. As the basic properties of the substrate are already established from the first polish, it is the goal of the subsequent polishing operation to simply re-establish the "epi ready" surface condition as quickly and cheaply as possible. Standard semiconductor grade polishing equipment is currently used for the refinishing operation; however, it will be difficult to meet the long term cost targets with that technology. The complex hardware and process formulations need to be simplified to allow a high throughput, low cost polish. This problem is encountered in other industries as well.

A system and method in accordance with the present invention modifies and improves upon the basic architecture of a polishing system that is utilized for polishing slabs of granite for example to meet the high throughput and quality requirements for the finishing of a workpiece. In an embodiment, an array of polishing heads is configured over a high speed conveyor system to enable the refinishing of substrates at very high speeds. To describe the features of the present invention in more detail refer now the following description in conjunction with the accompanying Figures.

FIG. 1 is a flow chart 100 of the operation of an automated polishing system in accordance with an embodiment. In this embodiment, first a polishing tool with multiple polishing heads is provided, via step 102. Next, a plurality of work pieces is held in a fixed position on a tray underneath the polishing head and moved thereunder, via step 104. Finally, the multiple polishing heads are configured with the appropriate pad/slurry combination of materials to polish the plurality of workpieces so as create a polished surface on the plurality of workpieces.

Figure 2:
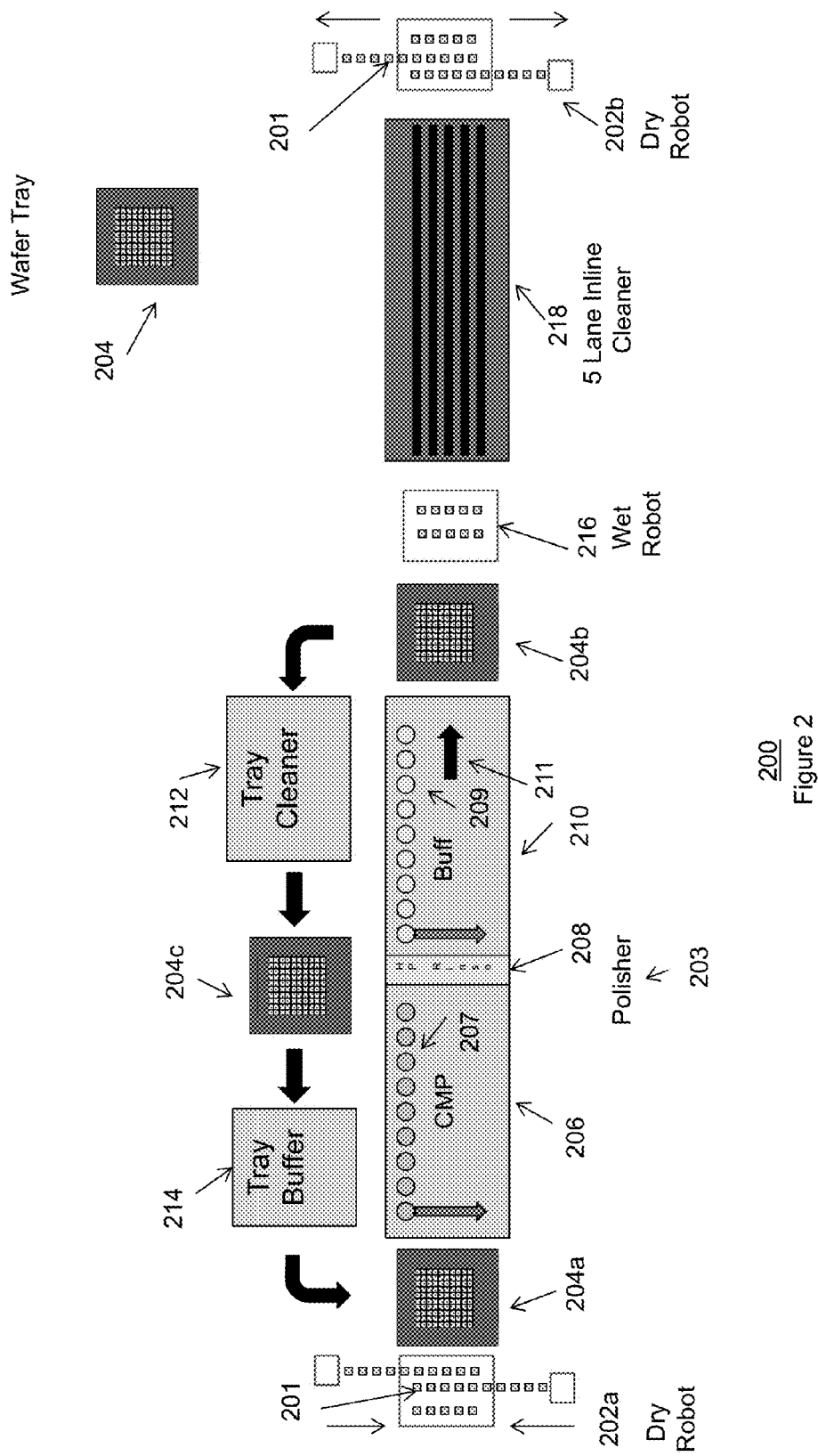
FIG. 2 illustrates a fully automated high throughput polishing system.
Figure 3A:
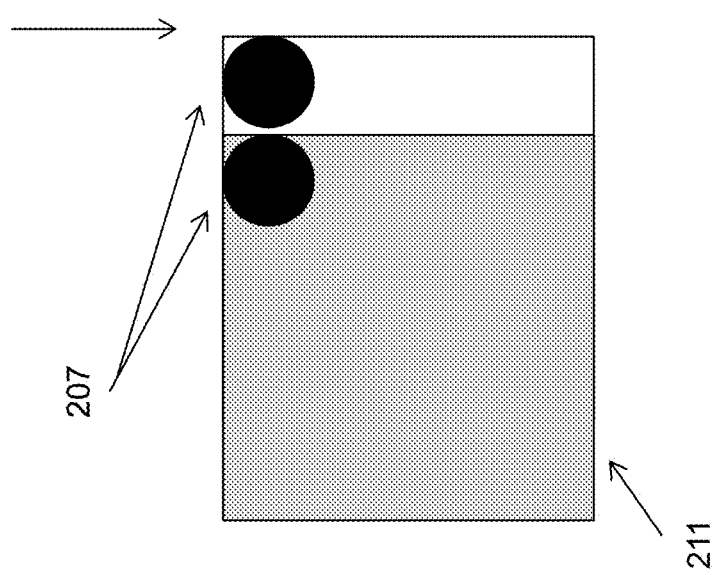
Figure 3B:
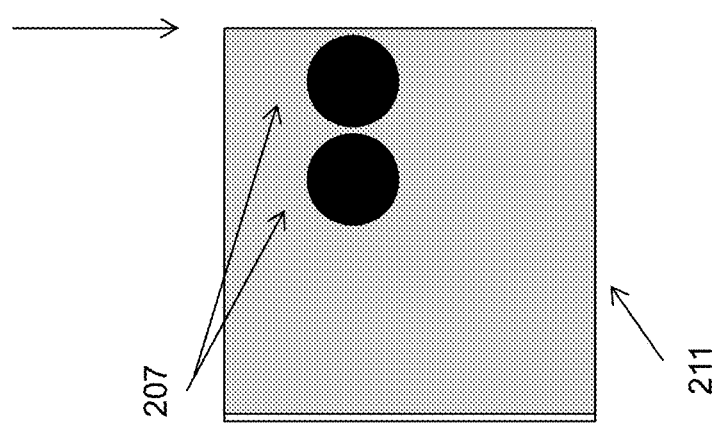
Figure 3C:
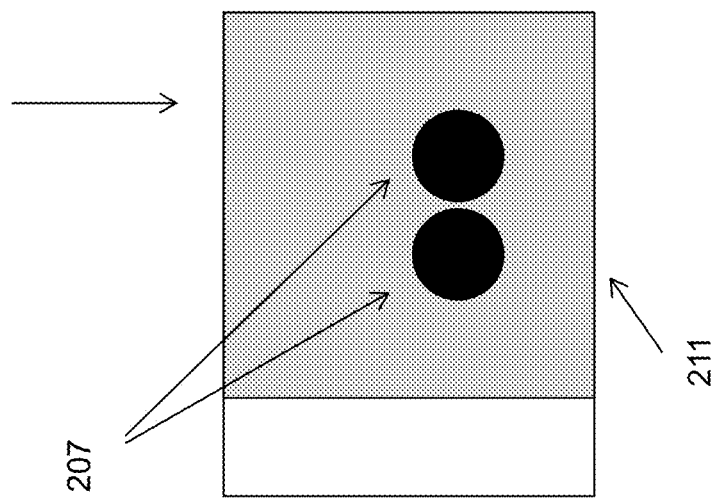
Figure 3D:
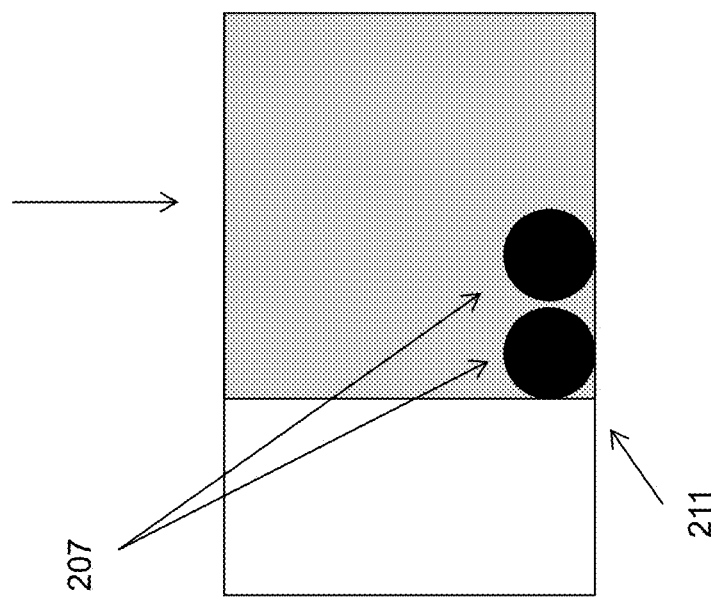
Figure 3F:
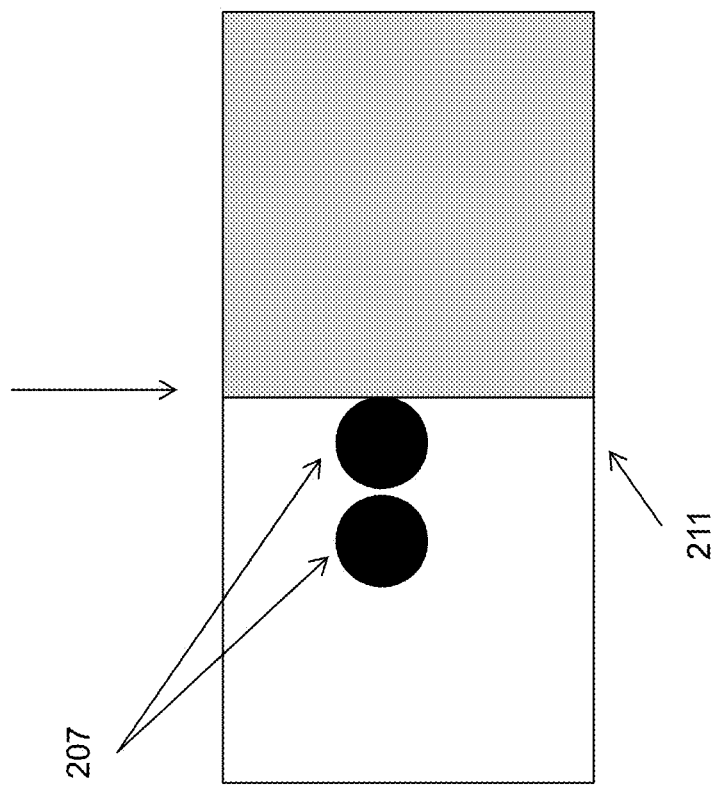
Figure 3G:
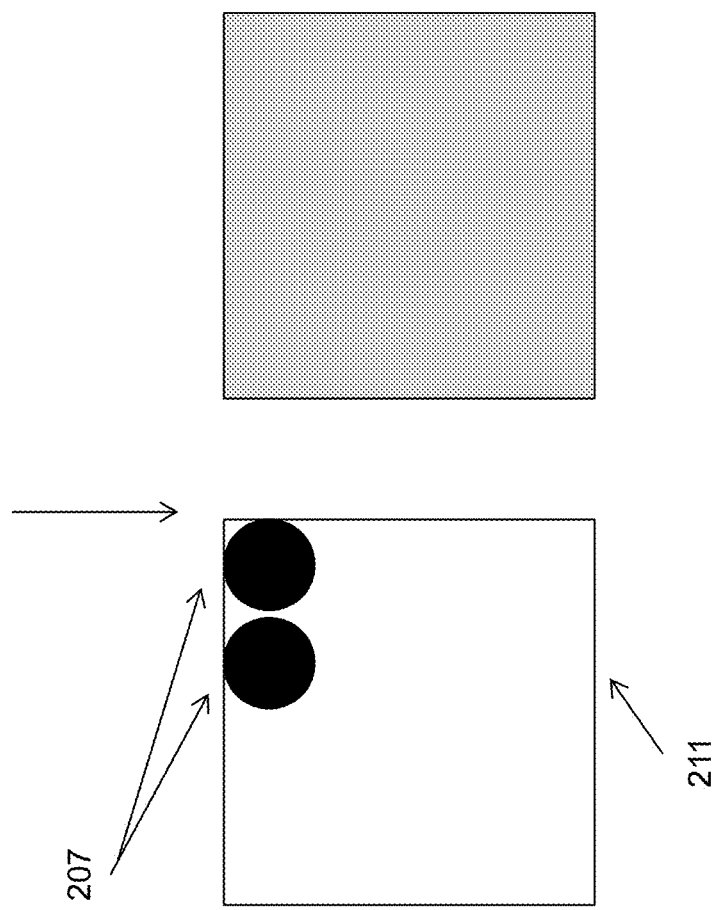

FIG. 2 illustrates a fully automated high throughput polishing system 200. The system 200 comprises dry robots 202a-b and a polisher 203. The polisher 203 includes a chemical mechanical polisher (CMP) 206, a high pressure (HP) rinse 208 coupled in series with the CMP 206 and a buff polisher 210 coupled on an opposite side of the HP rinse 208 from the CMP section 206. In an embodiment, the polisher 203 includes a conveyor system 211 which moves wafer trays 204 in a first (in this case horizontal) direction. The CMP 206 includes a first set of polishers 207 to provide for example a coarse granularity of polishing on the workpieces 201 and the buff polisher section 210 includes a second set of polishers 209 to provide fine granularity of polishing on the plurality of workpieces 201. In an embodiment, the first and second set of polishers 207 and 209 move in a second direction (in this case vertical) which is perpendicular to the direction of motion of the conveyor system 211. The system 200 also includes a wet robot 216, an inline cleaner 218, a tray cleaner 212 and a tray buffer 214.

In operation, the dry robot 202a lifts the plurality of workpieces 201 and deposits them on the wafer tray 204a. The workpieces 201 are held in place in the wafer tray 204a. In one embodiment, the workpieces 201 may be held in place by an adhesive or absorbent material. In another embodiment, the workpieces 201 may be held in place by vacuum while in the polisher 203. One of ordinary skill in the art readily recognizes that the workpieces 201 could be held in place in a variety of ways and that would be within the spirit and scope of the present invention.

The robot then places the wafer tray 204a into the polisher 203. As the wafer tray 204a moves along the conveyor system 211 of the polisher 203, first, the plurality of workpieces 201 are polished by the polishing heads 207 of the CMP 206 using a particular slurry combination. FIG. 3A-3G illustrates movement of the conveyor system 211 and two of the first set of the polishing heads 207 relative to the conveyer system. The two of the set of polishing heads 207 move in the vertical horizontal direction, while the conveyor system 211 moves in the horizontal direction.

Referring back to FIG. 2, the material from the first polishing is then removed via a high pressure (HP) rinse 208. After the HP rinse 208, the conveyor system 211 moves the wafer tray 204a through the buff polisher 210 where a second polishing step in a particular slurry combination takes place via the second set of polishing heads 209 to provide a finished polished surface. The relative movement of the second set of polishing heads 209 and the conveyor system 211 is the same as above described in FIGS. 3A-3G. In an embodiment, the finished polished surface could be an epi ready surface for an optoelectronic device such as a photovoltaic cell. One of ordinary skill in the art readily recognizes however that a variety of workpieces could be polished such as silicon wafers, magnetic disks, glass plates and the like.

At the end of the buff polishing, the wet robot 216 removes the plurality workpieces 201 from the wafer tray 204a and sends the workpieces 201 to the inline cleaner 218. In an embodiment the inline cleaner is an industry standard 5 Lane Inline Cleaner. The inline cleaner 218 then cleans the workpieces 201. Once the workpieces 201 have been cleaned, the workpieces 201 are removed from the tray 204a by the dry robot 202b and distributed accordingly.

As is seen in the Figure, after the workpieces 201 have been removed from the wafer tray 204a, the wafer tray 204a proceeds to the tray cleaner 212 to remove the slurry materials that have accumulated from the polishing. The wafer tray 204 is then transferred to the tray buffer 214. The tray buffer 214 to holds a plurality of trays and provides them appropriately as work pieces 201 are to be loaded thereon for entry into the polisher 203. One of ordinary skill in the art should recognize that the workpieces can be of different sizes and shapes and different trays may accommodate different types of workpieces.

A system and method in accordance with the present invention addresses providing a high throughput polishing system for workpieces by enabling a large polishing tool to polish small workpieces at a very high rate. These workpieces can include but are not limited to semiconductor devices, optoelectronic devices, magnetic devices and the like for which polishing is required. In an embodiment, a wafer tray is provided that can hold multiple workpieces in a fixed position. The polishing heads are configured with the appropriate pad/slurry combination to allow the creation of a finished polished surface on the workpieces. A system and method in accordance with the present invention is substantially faster, easier to automate and cheaper to build than conventional polishing systems for workpieces. It has been found that an approach in accordance with the present invention may provide an order of magnitude greater throughput over conventional approaches at a fraction of the cost.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

What is claimed is:

1. A method for polishing a plurality of workpieces comprising:
    placing a plurality of workpieces in a tray;
    moving the tray with the plurality of workpieces to a first position within a polishing tool, the polishing tool having multiple polishing heads comprising a first set of polishing heads and a second set of polishing heads, the plurality of workpieces being held simultaneously and in a fixed position on the tray within the polishing tool utilizing an adhesive material, a vacuum, or an absorbent material;
    polishing the plurality of workpieces using the first set of polishing heads, to a coarse granularity;
    moving the tray with the coarsely polished plurality of workpieces to a second position within the polishing tool; and
    polishing the plurality of workpieces, using the second set of polishing heads, to create a finished polished surface on the plurality of workpieces,
    wherein the multiple polishing heads are configured with a material selected from one of a pad material, slurry material, or a combination thereof to polish the plurality of workpieces first to the coarse granularity and then to create the finished polished surface on the plurality of workpieces.

2. The method of claim 1, wherein the plurality of workpieces comprises a plurality of semiconductor substrates.

3. The method of claim 1, wherein the plurality of workpieces comprises a plurality of optoelectronic devices.

4. The method of claim 3, wherein the plurality of optoelectronic devices comprises a plurality of photovoltaic devices.

5. The method of claim 4, wherein the polished surface of each of the plurality of photovoltaic devices is an epi-ready surface.

6. The method of claim 1, wherein:
moving the tray with the plurality of workpieces to the first position within a polishing tool includes moving the tray in a first direction,
polishing the plurality of workpieces, using the first set of polishing heads, includes moving the first set of polishing heads in a second direction perpendicular to the first direction,
moving the tray with the coarsely polished plurality of workpieces to the second position within the polishing tool includes moving the tray in the first direction, and
polishing the plurality of workpieces, using the second set of polishing heads, includes moving the second set of polishing heads in the second direction.

7. A system comprising:
a polisher including at least one set of polishing heads, wherein the at least one set of polishing heads comprises a first set of polishing heads and a second set of polishing heads, and wherein the first set of polishing heads polishes a plurality of workpieces to a coarse granularity and the second set of polishing heads provides a finished polished surface on the plurality of workpieces;
at least one wafer tray for holding the plurality of workpieces simultaneously in a fixed position, and wherein the plurality of workpieces are held in the fixed position utilizing an adhesive material, a vacuum, or an absorbent material; and
a conveyor system for moving the at least one wafer tray within the polisher from a first position where the first set of polishing heads polishes the plurality of workpieces to a coarse granularity to a second position where the second set of polishing heads provides the finished polished surface on the plurality of workpieces, wherein the at least one set of polishing heads are configured with the appropriate material selected from one of a pad material, slurry material, or a combination thereof to polish the plurality of workpieces first to the coarse granularity and then to create the finished polished surface on the plurality of workpieces.

8. The system of claim 7, wherein the conveyor system moves the at least one wafer tray in a first direction under the at least one set of polishing heads and the at least one set of polishing heads moves in a second direction that is perpendicular to the first direction.

9. The system of claim 8, wherein the plurality of workpieces comprises plurality of optoelectronic devices.

10. The system of claim 9, wherein the plurality of optoelectronic devices comprises a plurality of photovoltaic devices.

11. The system of claim 10, wherein the polished surface of each of the plurality of photovoltaic devices is an epi-ready surface.

12. An automated high throughput polishing system comprising:
a first dry robot for placing a plurality of workpieces in a wafer tray;
the wafer tray for holding the plurality of workpieces simultaneously and in a fixed position, wherein the plurality of workpieces are held in the fixed position in the wafer tray while the tray is within a polisher utilizing an adhesive material, a vacuum, or an absorbent material;
a conveyor system for receiving the wafer tray holding the plurality of workpieces from the first robot and moving the wafer tray from a first position to a second position within the polisher;
a polisher including a first set of polishing heads and a second set of polishing heads, wherein the first set of polishing heads polishes the plurality of workpieces to a coarse granularity at the first position within the polisher, and the second set of polishing heads provides a finished polished surface on the plurality of workpieces at the second position within the polisher, wherein the first set of polishing heads and the second set of polishing heads are configured with the appropriate material selected from one of a pad material, slurry material, or a combination thereof to polish the plurality of workpieces first to the coarse granularity and then to create the polished surface on the plurality of workpieces; and
an inline cleaner for cleaning the plurality of workpieces after polishing by the polisher.

13. The system of claim 12, wherein the conveyor system moves the wafer tray in a first direction under the first and second sets of polishing heads and the first and second sets of polishing heads move in a second direction that is perpendicular to the first direction.

14. The system of claim 12, wherein the plurality of workpieces comprises a plurality of optoelectronic devices.

15. The system of claim 14, wherein the plurality of optoelectronic devices comprises a plurality of photovoltaic devices.

16. The system of claim 15, wherein the polished surface of each of the plurality of photovoltaic devices is an epi-ready surface.

* * * * *